United States Patent
Lu

(10) Patent No.: US 8,151,150 B2
(45) Date of Patent: Apr. 3, 2012

(54) DATA STORAGE DEVICE AND METHOD FOR WRITING TEST DATA TO A MEMORY

(75) Inventor: Mau-Jung Lu, Taipei (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 104 days.

(21) Appl. No.: 12/705,644

(22) Filed: Feb. 15, 2010

(65) Prior Publication Data

US 2011/0035636 A1  Feb. 10, 2011

(30) Foreign Application Priority Data

Aug. 10, 2009 (TW) .............................. 98126688 A

(51) Int. Cl.
*G11C 29/00* (2006.01)
(52) U.S. Cl. ........................................ 714/719; 714/723
(58) Field of Classification Search .......... 714/718–723, 714/735, 743; 365/200–201
See application file for complete search history.

(56) References Cited

U.S. PATENT DOCUMENTS

| 5,469,443 | A  | * | 11/1995 | Saxena ........................... 714/720 |
| 6,397,349 | B2 | * | 5/2002 | Higgins et al. ................ 714/6.32 |
| 6,556,484 | B2 | * | 4/2003 | Yabe et al. ............... 365/189.05 |
| 2006/0227607 | A1 | * | 10/2006 | Park et al. ................ 365/185.12 |
| 2010/0306579 | A1 | * | 12/2010 | Baek et al. ......................... 714/6 |

* cited by examiner

*Primary Examiner* — Jeffrey A Gaffin
*Assistant Examiner* — Steve Nguyen
(74) *Attorney, Agent, or Firm* — Thomas|Kayden

(57) ABSTRACT

The invention provides a method for writing test data to a memory. In one embodiment, the memory comprises a data register. First, test data is written to a memory space of the memory. A read-back command and a read-back address of the memory space are then sent to the memory to direct the memory to read the test data from the memory space to the data register. A copy-back command and a copy-back command in a test range of the memory are then sent to the memory to direct the memory to write the test data stored in the data register to the copy-back address. Finally, when the test range of the memory has not been filled with the test data, the step of sending the read-back command and the read-back address is repeated, and the step of sending the copy-back command and the copy-back address is repeated.

15 Claims, 7 Drawing Sheets

DATA STORAGE DEVICE AND METHOD FOR WRITING TEST DATA TO A MEMORY

CROSS REFERENCE TO RELATED APPLICATIONS

This application claims priority of Taiwan Patent Application No. 98126688, filed on Aug. 10, 2009, the entirety of which is incorporated by reference herein.

BACKGROUND OF THE INVENTION

1. Field of the Invention

The invention relates to memories, and more particularly to testing of memories.

2. Description of the Related Art

Downgrade memories are memory chips with defective memory cells. When a manufacturer produces a batch of memory chips, the manufacturer performs a quality test to verify the quality of the batch of memory chips. If the batch of memory chips cannot fill requirements of the quality test, the memory chips are then marked as downgrade memory chips and sold in a price lower than that of normal memory chips.

Generally, a downgrade memory chip comprises a majority of memory cells capable of normally storing data. Only a portion of memory cells of the downgrade memory cell have defects due to errors in the manufacture process and cannot normally store data. When a data storage device uses a downgrade memory chip to store data, a controller of the data storage device must first scan all the memory cells of the downgrade memory chip to find the locations of the defective memory cells and then record the defective memory cells in a scan result. The controller of the data storage device can then store data in normal memory cells of the downgrade memory chip and avoid storing data in defective memory cells of the downgrade memory chip according to the scan result.

Referring to FIG. 1, a flowchart of a method 100 of testing a memory is shown. A controller can scan memory cells of a downgrade memory according to the method 100 to identify locations of defective memory cells of the downgrade memory. First, the controller sends a write command and a write address in a test range of a memory to the memory (step 102). The controller then sends test data to the memory (step 104). After the memory receives test data, the memory then writes the test data to the write address of the memory according to the write command. The controller then checks whether the test range of the memory has been filled with the test data (step 106). If not, the controller selects a new write address to be sent to the memory from the test range (step 108) and then sequentially sends a new write command, the new write address, and the test data to the memory to direct the memory to write the test data to the new write address (steps 102 and 104). Thus, the test range of the memory is gradually written with the test data.

After the test range of the memory is filled with the test data (step 106), the controller sends a read command and a read address in the test range to the memory (step 110). When the memory receives the read command and the read address, the memory reads data from the read address according to the read command to obtain read-out data, and sends the read-out data to the controller. When the controller receives the read-out data (step 112), the controller compares the read-out data with the test data (step 114). When the read-out data is not identical to the test data, the memory cells corresponding to the read address are identified as defective memory cells, and the controller records the read address as a defective address in the scan result (step 116). When the read-out data is identical to the test data, the memory cells corresponding to the read address are identified as normal memory cells. If the addresses in the test range of the memory have not been completely read (step 118), the controller selects a new read address to be sent to the memory from the test range (step 120), and then sends a new read command and the new read address to the memory. After all addresses in the test range have been read, the controller can identify all defective memory cells in the test range according to the defective addresses recorded in the scan result.

Although the method 100 shown in FIG. 1 can precisely identify defective addresses, the method 100 has shortcomings. Whenever the controller writes test data to the memory, the controller must send test data to the memory. Sending the test data from the controller to the memory requires a data transmission period which causes delay to the entire memory test process. Referring to FIG. 2A, a block diagram of a data storage device 200 is shown. The data storage device 200 comprises a controller 202 and a nonvolatile memory 204. The controller 202 comprises a data buffer 214 storing test data. Whenever the controller 202 writes test data to the nonvolatile memory 204, the controller 202 must send the test data to the nonvolatile memory 204. After the nonvolatile memory 204 receives the test data from the controller 202, the nonvolatile memory 204 then stores the test data in a data register 224, and then writes the test data from the data register 224 to a memory cell with a write address. For example, to write the test data to the memory cell 241, the controller 202 has to send the test data to the nonvolatile memory 204 via the data path 231. To write the test data to the memory cell 242, the controller 202 still has to send the test data again to the nonvolatile memory 204 via the data path 232.

A controller generally sends data of a page to a memory. Because the data amount of a page is huge, transmission of page data from the controller to the memory requires a long period. Referring to FIG. 2B, a schematic diagram of transmission of a write command and a write address from a controller to a memory is shown. The controller first sends a write command 80h to the memory, and then sends a write address to the memory, wherein the write address comprises column addresses $CA_1$ and $CA_2$ and row addresses $RA_1$, $RA_2$, and $RA_3$. Finally, the controller sends test data $D_1 \sim D_N$ to the memory. If the test data has a data length of 2 KB, and a byte is transmitted from the controller to the memory in a clock cycle, transmission of the test data requires a total period of 2K clock cycles. If the test data is repeatedly sent to the memory in the memory test process, the memory test process is therefore delayed by a long data transmission period. A method of efficiently writing test data to a memory is therefore required.

BRIEF SUMMARY OF THE INVENTION

The invention provides a method for writing test data to a memory. In one embodiment, the memory comprises a data register. First, test data is written to a memory space of the memory. A read-back command and a read-back address of the memory space are then sent to the memory to direct the memory to read the test data from the memory space to the data register. A copy-back command and a copy-back command in a test range of the memory are then sent to the memory to direct the memory to write the test data stored in the data register to the copy-back address. Finally, when the test range of the memory has not been filled with the test data, the step of sending the read-back command and the read-back address is repeated, and the step of sending the copy-back command and the copy-back address is repeated after the copy-back address is set to a new copy-back address selected from the test range.

The invention further provides a method for testing a memory. First, a memory is directed to read test data from a read-back address of a memory space to a data register of the memory. The memory is then directed to write the test data stored in the data register to a copy-back address of a test range. When the test range of the memory has not been filled with the test data, the step of directing the memory to read the test data is repeated, and the step of directing the memory to write the test data is repeated after the copy-back address is set to a new copy-back address selected from the test range. When the test range of the memory has been filled with the test data, the memory is directed to read a plurality of read addresses to obtain a plurality of read-out data segments. The read-out data segments are then compared with the test data. When the read-out data segments are not identical to the test data, the read addresses corresponding to the read-out data segments are recorded in a defect table.

The invention provides a data storage device. In one embodiment, the data storage device comprises a memory and a controller. The memory comprises a data register. The controller writes test data to a memory space of the memory, sends a read-back command and a read-back address of the memory space to the memory to direct the memory to read the test data from the memory space to the data register, sends a copy-back command and a copy-back command in a test range of the memory to the memory to direct the memory to write the test data stored in the data register to the copy-back address, and repeats sending of the read-back command and the read-back address and sending of the copy-back command and the copy-back address when the test range of the memory has not been filled with the test data.

The invention provides a data storage device. In one embodiment, the data storage device comprises a memory and a controller. The memory comprises a data register. The controller directs the memory to read test data from a read-back address of a memory space to a data register of the memory, directs the memory to write the test data stored in the data register to a copy-back address of a test range, repeats directing the memory to read the test data and directing the memory to write the test data when the test range of the memory has not been filled with the test data, directs the memory to read a plurality of read addresses to obtain a plurality of read-out data segments when the test range of the memory has been filled with the test data, compares the read-out data segments with the test data, and records the read addresses corresponding to the read-out data segments in a defect table when the read-out data segments are not identical to the test data.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
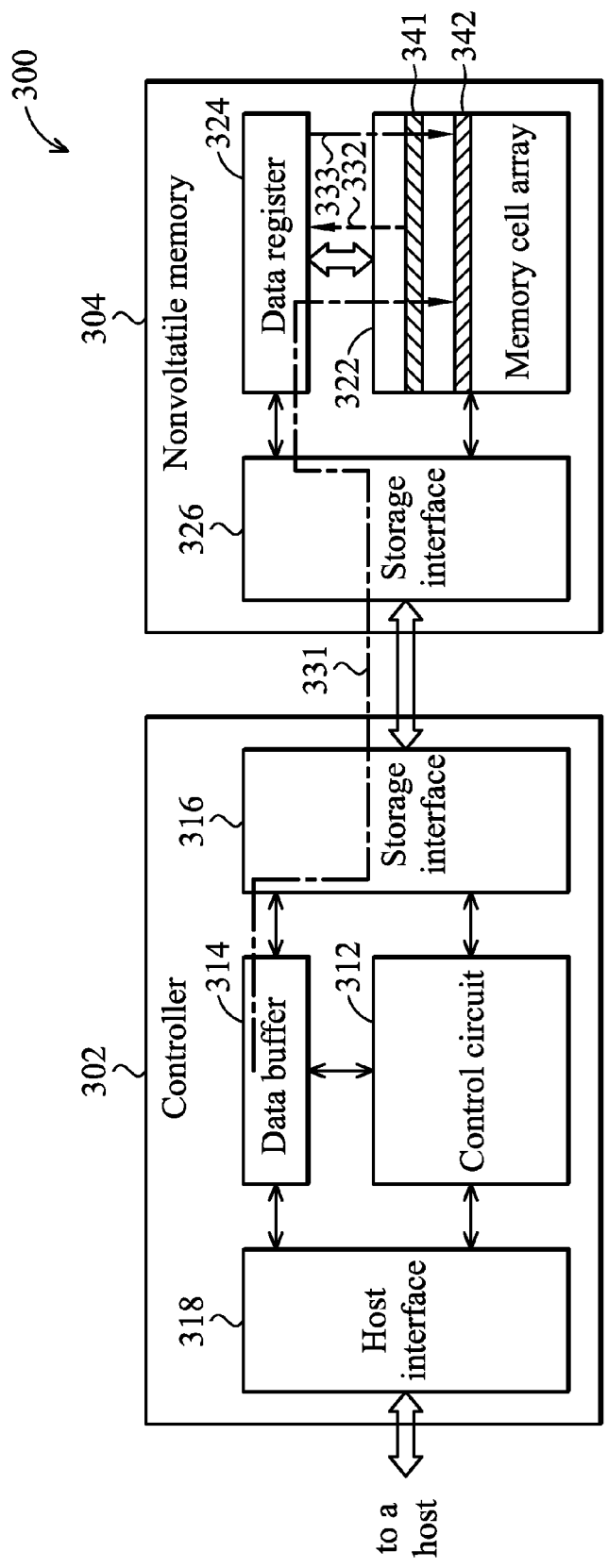
FIG. 3 is a block diagram of a data storage system according to the invention.

Referring to FIG. 3, a block diagram of a data storage system 300 according to the invention is shown. In one embodiment, the data storage system 300 comprises a controller 302 and a nonvolatile memory 304. The controller 302 gradually writes test data to a test range of the nonvolatile memory 304, reads the test range of the nonvolatile memory 304 to obtain read-out data, and compares the read-out data with the test data to identify defective memory cells in the test range of the nonvolatile memory 304. When the controller 302 writes the test data to the nonvolatile memory 304, the controller 302 does not repeatedly send the test data to the nonvolatile memory 304. The controller 302 only sends the test data once to the nonvolatile memory 304, and the nonvolatile memory 304 writes the test data to a first write address. Subsequently, when the controller 302 wants to write the test data to a second write address in a test range, the controller 302 directs the nonvolatile memory 304 to read the test data from the first write address to a data register 324, and then directs the nonvolatile memory 304 to write the test data stored in the data register 324 to the second write address. The controller 302 can therefore avoid repeatedly sending the test data to the nonvolatile memory 304. The time period required by an entire memory test process is therefore shortened, thus improving system performance.

In one embodiment, the controller 302 comprises a control circuit 312, a data buffer 314, a storage interface 316, and a host interface 318. In one embodiment, the nonvolatile memory 304 comprises a memory cell array 322, a data register 324, and a storage interface 326. The host interface 318 is for data communication between a host and the controller 302. The control circuit 312 is a core circuit of the controller 302 and controls other component circuits of the controller 302. The storage interfaces 316 and 326 are for data communication between the controller 302 and the nonvolatile memory 304. The memory cell array 322 of the nonvolatile memory 304 comprises a plurality of memory cells for data storage. When the controller 302 wants to write test data to the nonvolatile memory 304, the controller 302 first stores the test data in the data buffer 314. The controller 302 then transmits the test data stored in the data buffer 314 to the nonvolatile memory 304 via the storage interface 316. The nonvolatile memory 304 then receives the test data via the storage interface 326 and then stores the test data in the data register 324. The nonvolatile memory 304 then writes the test data stored in the data register 324 to a memory cell 341 of the memory cell array 322 according to a write command sent from the controller 302.

When the controller 302 directs the nonvolatile memory 304 to write the test data thereto for the first time, the controller 302 sends the test data to the nonvolatile memory 304 via a data path 331. Assume that the test data is written to a memory cell 341 of the nonvolatile memory 304. When the controller 302 subsequently directs the nonvolatile memory 304 to write the test data to other addresses, the controller 302 does not send the test data to the nonvolatile memory 304 again. The controller 302 sends a readback command to the nonvolatile memory 304 to direct the nonvolatile memory 304 to read the test data from the memory cell 341 to the data register 324 via the data path 332. The controller 302 then sends a copyback command to the nonvolatile memory 304 to direct the nonvolatile memory 304 to write the test data stored in the data register 324 to the memory cell 342 via the data path 333. Thus, the controller 302 only sends the readback command and the copyback command to the nonvolatile memory 304 without sending the test data again to the nonvolatile memory 304, and the test data is written to the memory cell 342. The controller 302 provided by the invention therefore writes test data to the nonvolatile memory 304 in a shorter time period in comparison with the conventional controller 202. The system performance of the data storage device 300 is therefore improved.

Figure 4:
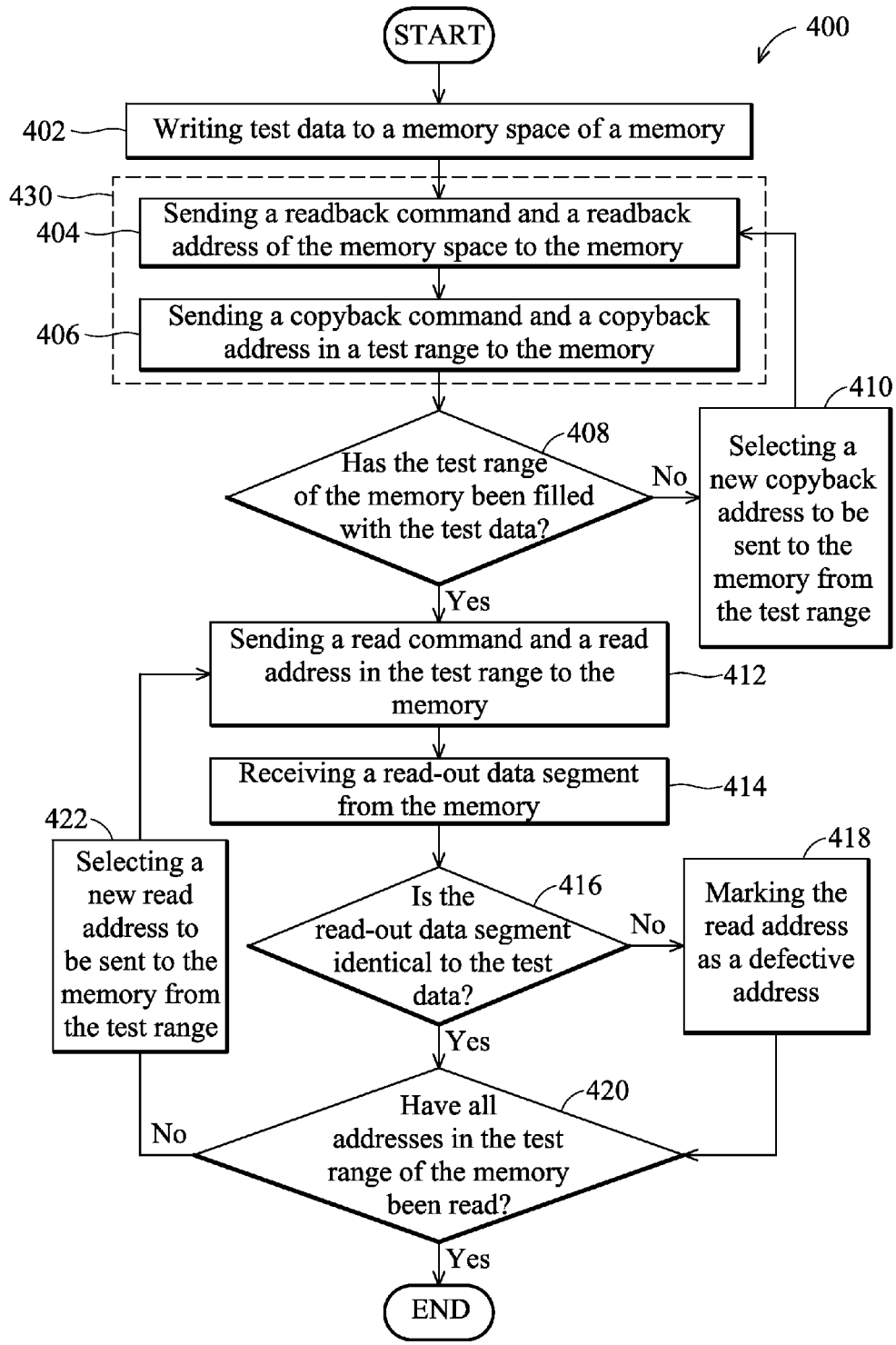
FIG. 4 is a flowchart of a method for testing a memory according to the invention.

Referring to FIG. 4, a flowchart of a method 400 for testing a memory according to the invention is shown. First, the controller 302 writes test data to a memory space of the nonvolatile memory 304 (step 402). In one embodiment, the memory space is the memory cell 341 of the memory cell array 322. In one embodiment, the memory space is a page or a block of the nonvolatile memory 304. The controller 302 then sends a readback command and a readback address of the memory space to the nonvolatile memory 304 (step 404). When the nonvolatile memory 304 receives the readback command, the nonvolatile memory 304 reads the test data from the memory space according to the readback address and then stores the test data in the data register 324. The controller 302 then sends a copyback command and a copyback address in a test range to the nonvolatile memory 304 (step 406). Assume that the copyback address is the address of another memory cell 342 of the memory cell array 322. The nonvolatile memory 304 therefore writes the test data stored in the data register 324 to the memory cell 342 according to the copyback address. The controller 302 therefore writes the test data to the memory cell 342 without sending the test data to the nonvolatile memory 304 again.

The controller 302 then determines whether the test range of the nonvolatile memory 304 has been filled with the test data (step 408). If not, the controller 302 selects a new copyback address from the test range (step 410), and sequentially sends a readback command, a copyback command, and the new copyback address to the nonvolatile memory 304 (steps 404 and 406). The controller 302 can therefore gradually fill the test range with the test data. In another embodiment, data capacity of the memory space is greater than that of the data register 324, and the controller 302 updates the readback address with a new readback address at step 404, thus reading a portion of test data from the new read-back address to the data register 324.

When the test range of the nonvolatile memory 304 has been filled with test data (step 408), the controller 302 sends a read command and a read address in the test range to the nonvolatile memory 304 (step 412). When the nonvolatile memory 304 receives the read command and the read address, the nonvolatile memory 304 reads the read-out data segment from the read address and sends the read-out data to the controller 302. When the controller 302 receives the read-out data segment (step 414), the controller 302 compares the read-out data segment with the test data. If the read-out data segment is not identical to the test data (step 416), the memory cell corresponding to the read address is defective, and the controller 302 records the read address as a defective address in a scan result (step 418). If the read-out data segment is identical to the test data (step 416), the memory cell corresponding to the read address is a normal memory cell. If the addresses in the test range of the nonvolatile memory 304 have not been completely read, the controller 302 then selects a new read address from the test range (step 422), sends a new read command and the new read address to the nonvolatile memory 304, and compares the new read-out data segment of the new read address with the test data to determine whether the new read address is a defective address until all addresses in the test range have been read (step 420). Thus, the controller 302 can then determine all defective addresses in the test range of the nonvolatile memory 304 according to the method 400.

Figure 1:
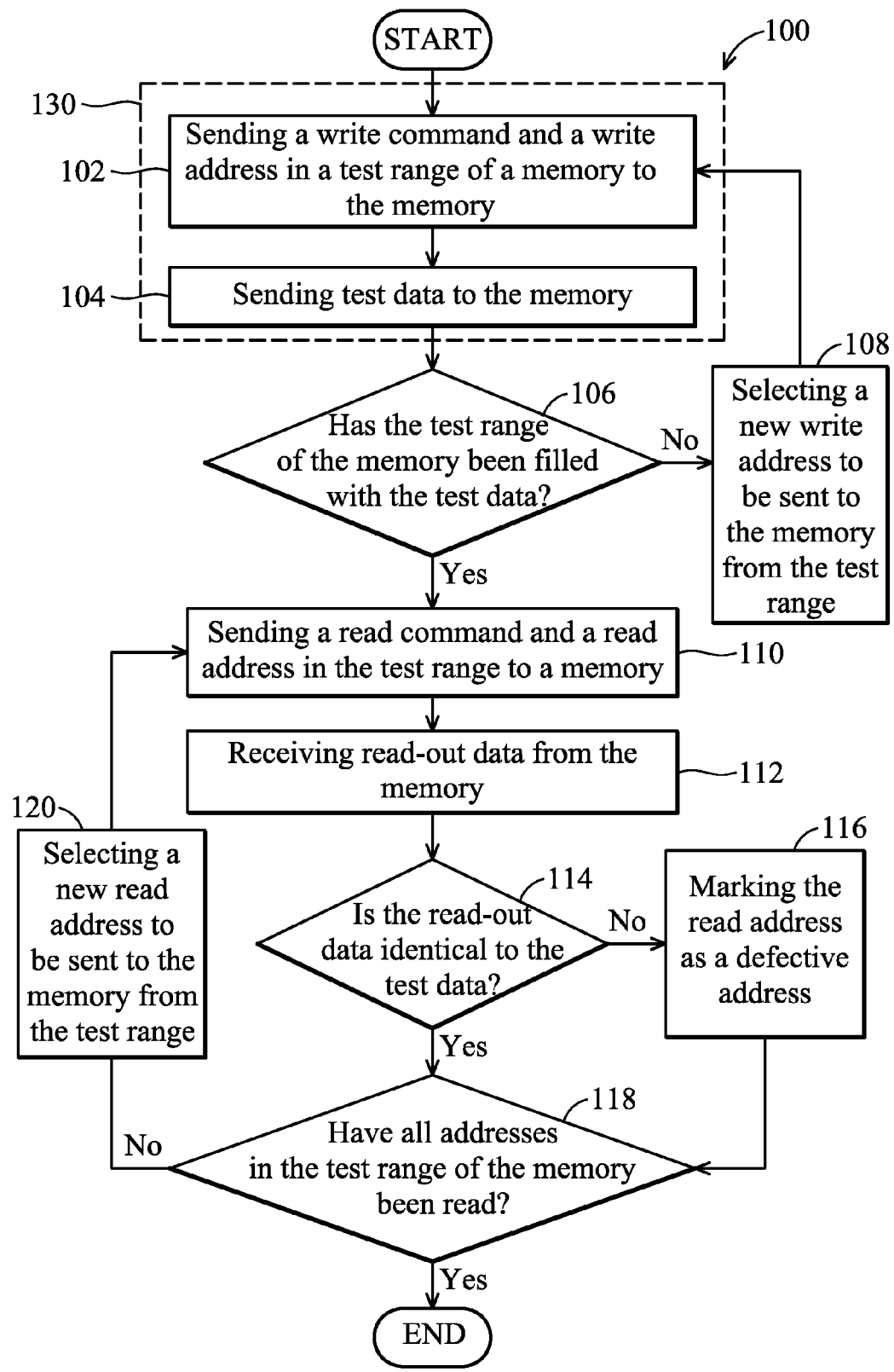
FIG. 1 is a flowchart of a method for testing a memory.
Figure 2A:
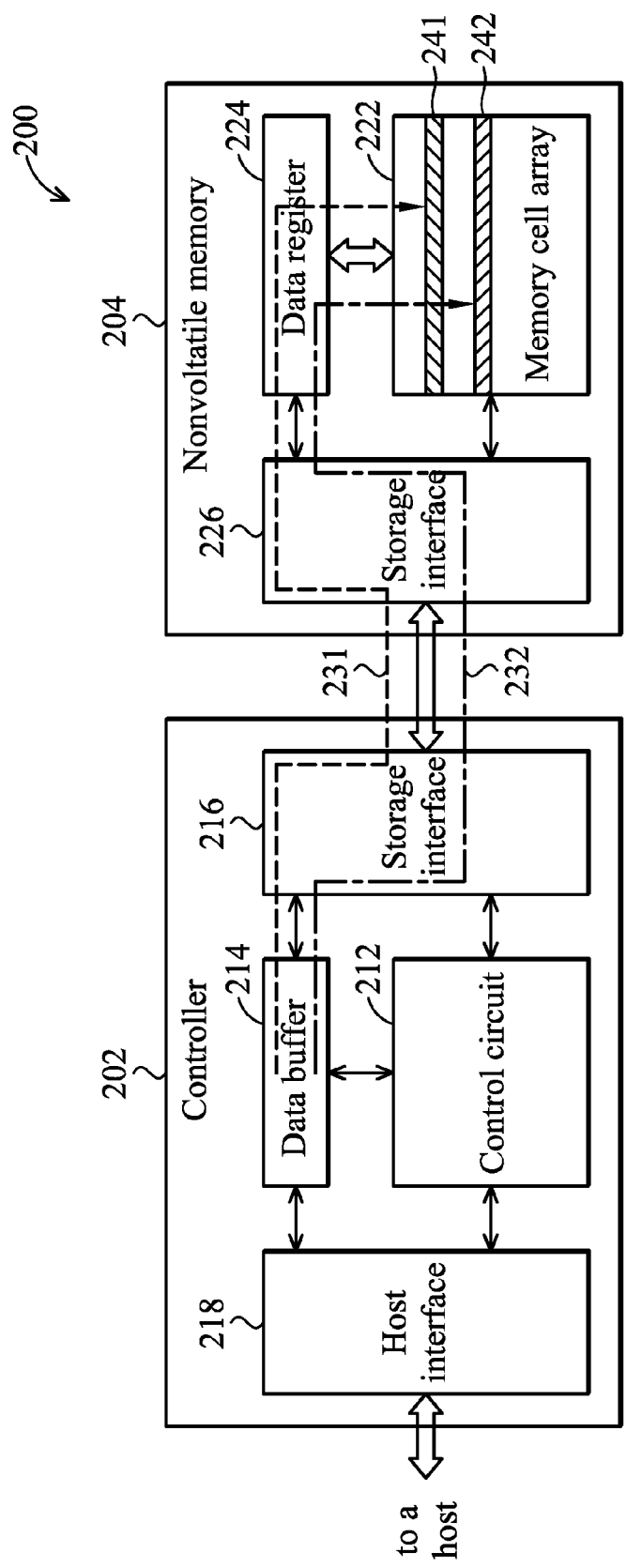
FIG. 2A is a block diagram of a data storage device.
Figure 2B:
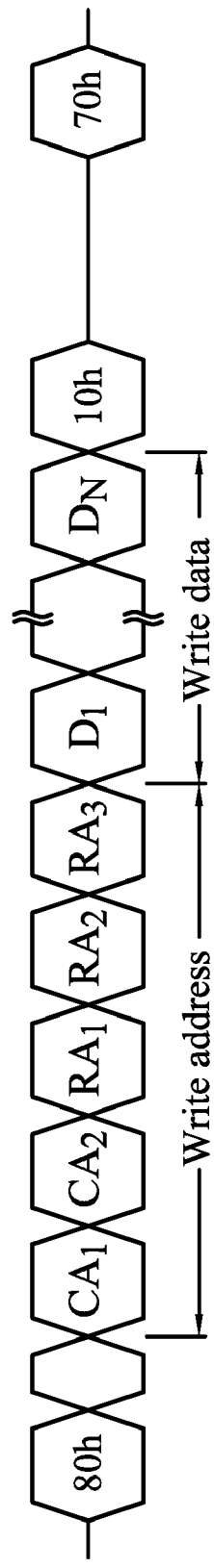
FIG. 2B is a schematic diagram of transmission of a write command and a write address from a controller to a memory.
Figure 5A:
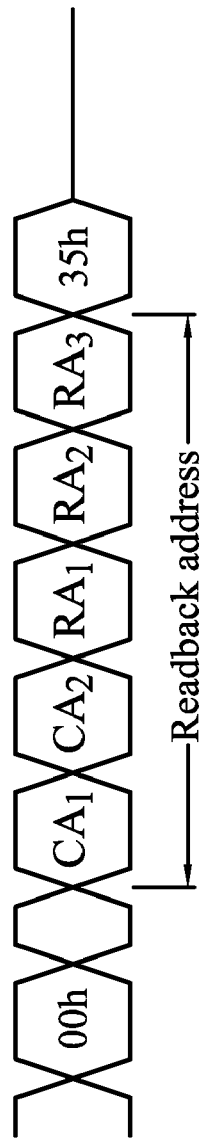
FIG. 5A is a schematic diagram of transmission of a read-back command according to the invention.
Figure 5B:
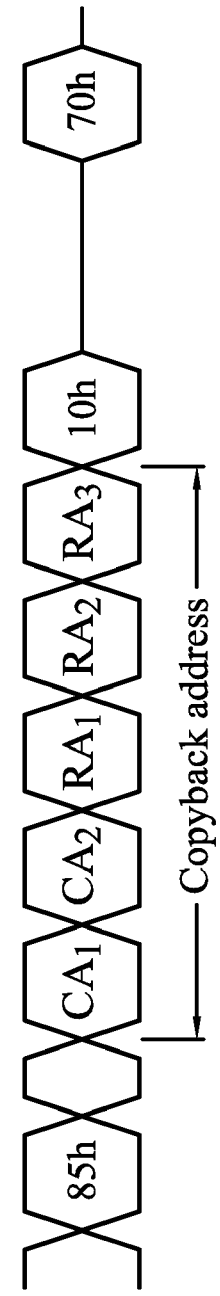
FIG. 5B is a schematic diagram of transmission of a copy-back command according to the invention.

Referring to FIG. 5A, a schematic diagram of transmission of a readback command according to the invention is shown. The controller 302 first sends a first-portion readback command 00h to the nonvolatile memory 304. The controller 302 then sends a readback address to the nonvolatile memory 304, wherein the readback address comprising column addresses $CA_1$ and $CA_2$ and row addresses $RA_1$, $RA_2$, and $RA_3$. The controller 302 then sends a second-portion readback command 35h to the nonvolatile memory 304. Referring to FIG. 5B, a schematic diagram of transmission of a copyback command according to the invention is shown. The controller 302 first sends a first-portion copyback command 85h to the nonvolatile memory 304. The controller 302 then sends a copyback address to the nonvolatile memory 304, wherein the copyback address comprising column addresses $CA_1$ and $CA_2$ and row addresses $RA_1$, $RA_2$, and $RA_3$. The controller 302 then sends a second-portion copyback command 10h to the nonvolatile memory 304. In comparison with the readback command and the copyback command shown in FIGS. 2A and 2B, transmission of the readback command and the copyback command shown in FIGS. 5A and 5B does not comprise transmission of write data $D_1$~$D_N$, and thus reduces the time period for writing test data to the nonvolatile memory 304, and improves system performance.

Figure 6A:
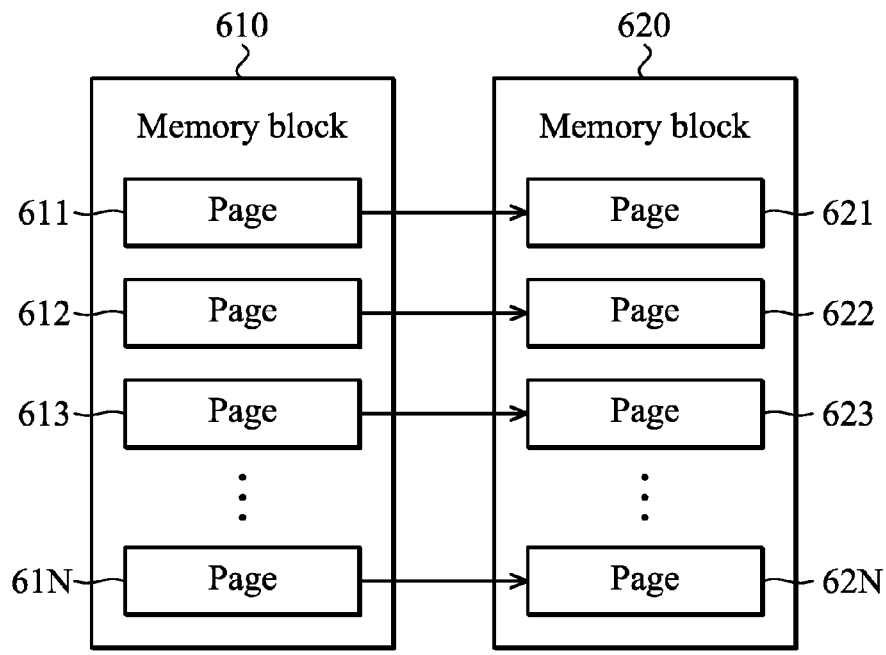
FIG. 6A is a schematic diagram of an embodiment of writing test data to a memory according to the invention.

Referring to FIG. 6A, a schematic diagram of an embodiment of writing test data to a memory according to the invention is shown. Assume that the controller 302 has filled a memory block 610 of the nonvolatile memory 304 with test data, and the memory block 610 comprises a plurality of pages 611, 612, 613, . . . , 61N. The controller 302 can therefore sequentially send readback commands to the nonvolatile memory 304 to direct the nonvolatile memory 304 to read test data stored in the pages 611, 612, 613, . . . , 61N to the data register 324, and then sequentially send copyback commands to the nonvolatile memory 304 to direct the nonvolatile memory 304 to write test data stored in the data register 324 to pages 621, 622, 623, . . . , 62N of another memory block 620, wherein the test data written to the pages 621, 622, 623, . . . , 62N are respectively identical to those stored in the pages 611, 612, 613, . . . , 61N.

Figure 6B:
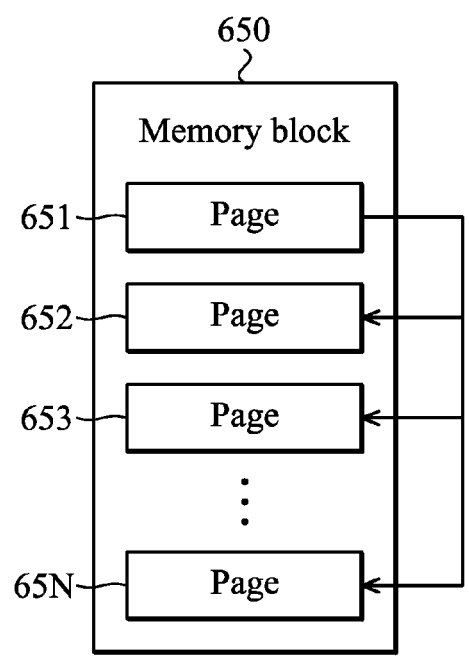
FIG. 6B is a schematic diagram of another embodiment of writing test data to a memory according to the invention.

Referring to FIG. 6B, a schematic diagram of another embodiment of writing test data to a memory according to the invention is shown. Assume that the controller 302 has filled a page 651 of a memory block 650 of the nonvolatile memory 304 with test data, and the memory block 650 comprises a plurality of pages 651, 652, 653, . . . , 65N. The controller 302 can therefore sequentially send readback commands to the nonvolatile memory 304 to direct the nonvolatile memory 304 to read test data stored in the page 651 to the data register 324, and then sequentially send copyback commands to the nonvolatile memory 304 to direct the nonvolatile memory 304 to write test data stored in the data register 324 to pages 652, 653, ..., 65N of the memory block 650, wherein the test data written to the pages 652, 653, ..., 65N are identical to that stored in the page 651.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for writing test data to a memory, wherein the memory comprises a data register, the method comprising:
   writing test data to a memory space of the memory;
   sending a read-back command and a read-back address of the memory space to the memory to direct the memory to read the test data from the memory space to the data register;
   sending a copy-back command and a copy-back address in a test range of the memory to the memory to direct the memory to write the test data stored in the data register to the copy-back address; and
   when the test range of the memory has not been filled with the test data, repeating the step of sending the read-back command and the read-back address, and repeating the step of sending the copy-back command and the copy-back address after the copy-back address is set to a new copy-back address selected from the test range;
   wherein sending of the read-back command and the read-back address comprises:
   sending a first-portion read-back command with a value of 00H to the memory;
   sending the read-back address to the memory; and
   sending a second-portion read-back command with a value of 35H to the memory.

2. The method as claimed in claim 1, wherein sending of the copy-back command and the copy-back address comprises:
   sending a first-portion copy-back command with a value of 85H to the memory;
   sending the copy-back address to the memory; and
   sending a second-portion copy-back command with a value of 13H to the memory.

3. The method as claimed in claim 1, wherein the memory space is a page of the memory.

4. The method as claimed in claim 1, wherein the memory space and the test range are blocks of the memory, the step of sending the read-back command and the read-back address is repeated after the read-back address is set to a new read-back address and when the test range of the memory has not been filled with the test data, and in the memory space the new read-back address has a location corresponding to the location of the new copy-back address in the test range.

5. A method for testing a memory, comprising:
   directing a memory to read test data from a read-back address of a memory space to a data register of the memory;
   directing the memory to write the test data stored in the data register to a copy-back address of a test range;
   when the test range of the memory has not been filled with the test data, repeating the step of directing the memory to read the test data, and repeating the step of directing the memory to write the test data after the copy-back address is set to a new copy-back address selected from the test range;
   when the test range of the memory has been filled with the test data, directing the memory to read a plurality of read addresses to obtain a plurality of read-out data segments;
   comparing the read-out data segments with the test data; and
   when the read-out data segments are not identical to the test data, recording the read addresses corresponding to the read-out data segments in a defect table;
   wherein directing the memory to read the test data comprises sending a read-back command and the read-back address to the memory, and sending of the read-back command and the read-back address comprises:
   sending a first-portion read-back command with a value of 00H to the memory;
   sending the read-back address to the memory; and
   sending a second-portion read-back command with a value of 35H to the memory.

6. The method as claimed in claim 5, wherein the memory space is a page of the memory.

7. The method as claimed in claim 6, wherein directing the memory to write the test data comprises sending a copy-back command and the copy-back address to the memory.

8. The method as claimed in claim 7, wherein sending of the copy-back command and the copy-back address comprises:
   sending a first-portion copy-back command with a value of 85H to the memory;
   sending the copy-back address to the memory; and
   sending a second-portion copy-back command with a value of 13H to the memory.

9. A data storage device, comprising:
   a memory, comprising a data register; and
   a controller, coupled to the memory, writing test data to a memory space of the memory, sending a read-back command and a read-back address of the memory space to the memory to direct the memory to read the test data from the memory space to the data register, sending a copy-back command and a copy-back address in a test range of the memory to the memory to direct the memory to write the test data stored in the data register to the copy-back address, and when the test range of the memory has not been filled with the test data, repeat the action of sending of the read-back command and the read-back address after the read back address is set to a new read back address selected from the memory space, and repeat the action of sending of the copy-back command and the copy-back address after the copy back address is set to a new copy back address selected from the test range;
   wherein the controller sends a first-portion read-back command with a value of 00H to the memory, sends the read-back address to the memory, and then sends a second-portion read-back command with a value of 35H to the memory, thereby sending of the read-back command and the read-back address to the memory.

10. The data storage device as claimed in claim 9, wherein the controller sends a first-portion copy-back command with a value of 85H to the memory, sends the copy-back address to the memory, and then sends a second-portion copy-back command with a value of 13H to the memory, thereby sending of the copy-back command and the copy-back address to the memory.

11. The data storage device as claimed in claim 9, wherein the memory space is a page of the memory.

12. The data storage device as claimed in claim 9, wherein the memory space and the test range are blocks of the memory, the controller repeats sending of the read-back command and the read-back address after the read-back address is set to a new read-back address selected from the memory space, and in the memory space the new read-back address has a location corresponding to the location of the new copy-back address in the test range.

13. A data storage device, comprising:

a memory, comprising a data register; and a controller, directing the memory to read test data from a read-back address of a memory space to a data register of the memory, directing the memory to write the test data stored in the data register to a copy-back address of a test range, repeating directing the memory to read the test data and directing the memory to write the test data when the test range of the memory has not been filled with the test data, directing the memory to read a plurality of read addresses to obtain a plurality of read-out data segments when the test range of the memory has been filled with the test data, comparing the read-out data segments with the test data, and recording the read addresses corresponding to the read-out data segments in a defect table when the read-out data segments are not identical to the test data;

wherein the controller sends a read-back command and the read-back address to the memory, thereby directing the memory to read the test data, and the controller sends a first-portion read-back command with a value of 00H to the memory, sends the read-back address to the memory, and sends a second-portion read-back command with a value of 35H to the memory, thereby sending the read-back command and the read-back address to the memory.

14. The data storage device as claimed in claim 13, wherein the controller sends a copy-back command and the copy-back address to the memory, thereby directing the memory to write the test data.

15. The data storage device as claimed in claim 14, wherein the controller sends a first-portion copy-back command with a value of 85H to the memory, sends the copy-back address to the memory, and then sends a second-portion copy-back command with a value of 13H to the memory, thereby sending the copy-back command and the copy-back address to the memory.

* * * * *